United States Patent
Joo et al.

(10) Patent No.: US 7,326,520 B2
(45) Date of Patent: Feb. 5, 2008

(54) COPOLYMER OF ALICYCLIC OLEFIN HAVING SECONDARY HYDROXYL GROUP AND ACRYL COMPOUND, AND CHEMICALLY AMPLIFIED RESIST COMPOSITION CONTAINING THE SAME

(75) Inventors: Hyun-Sang Joo, Chungcheongnam-do (KR); Joo-Hyeon Park, Chungcheongnam-do (KR); Dong-Chul Seo, Chungcheongnam-do (KR); Young-Taek Lim, Chungcheongnam-do (KR); Seong-Duk Cho, Gwangju-si (KR); Ji-Young Song, Chungcheongnam-do (KR); Kyoung-Mun Kim, Chungcheongnam-do (KR)

(73) Assignee: Korea Kumho Petrochemical Co., Ltd., Chongno-gu Seoul (KR)

( * ) Notice: Subject to any disclaimer, the term of this patent is extended or adjusted under 35 U.S.C. 154(b) by 53 days.

(21) Appl. No.: 11/108,397

(22) Filed: Apr. 18, 2005

(65) Prior Publication Data

US 2006/0057490 A1    Mar. 16, 2006

(30) Foreign Application Priority Data

Sep. 13, 2004    (KR)    ............... 10-2004-0072926

(51) Int. Cl.
```
G03F 7/30      (2006.01)
G03F 7/038     (2006.01)
C08F 224/00    (2006.01)
C08F 236/00    (2006.01)
```
(52) U.S. Cl. ............... 430/280.1; 430/270.1; 430/326; 430/325; 430/967; 525/273; 525/281; 525/282

(58) Field of Classification Search .......... None
See application file for complete search history.

(56) References Cited

U.S. PATENT DOCUMENTS 6,013,416 A    1/2000    Nozaki et al.

(Continued)

OTHER PUBLICATIONS

Modern Plastics; Harper, Charles A. Modern Plastics Handbook. McGraw-Hill. p. A.17. Year 2000.□□Online version available at: http://www.knovel.com/knovel2/Toc.jsp?BookID=1008 &VerticalID=0.*

(Continued)

*Primary Examiner*—Cynthia Hamilton
(74) *Attorney, Agent, or Firm*—Davidson, Davidson, & Kappel, LLC

(57) ABSTRACT

The present invention provides a polymer represented by the following formula 1 and a chemically amplified resist composition including the polymer, which resist composition is excellent in adhesion, storage stability and dry etch resistance, with good resolution in both C/H and L/S patterns, and provides a good pattern profile irrespective of the type of the substrate due to its good process window:

Formula 1

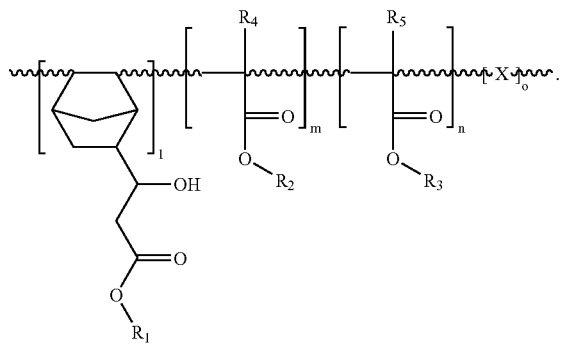

9 Claims, 15 Drawing Sheets

U.S. PATENT DOCUMENTS

| | | | |
|---|---|---|---|
| 6,063,542 A * | 5/2000 | Hyeon et al. | 430/270.1 |
| 6,146,810 A * | 11/2000 | Seo et al. | 430/270.1 |
| 6,268,106 B1 * | 7/2001 | Park et al. | 430/270.1 |
| 6,358,666 B1 * | 3/2002 | Seo et al. | 430/270.1 |
| 6,369,143 B1 * | 4/2002 | Park et al. | 524/157 |
| 6,403,822 B2 * | 6/2002 | Watanabe et al. | 560/116 |
| 6,492,090 B2 * | 12/2002 | Nishi et al. | 430/270.1 |
| 6,641,974 B2 * | 11/2003 | Kim et al. | 430/270.1 |
| 2005/0153236 A1 * | 7/2005 | Lim et al. | 430/270.1 |

OTHER PUBLICATIONS

"olefin", Hawley's Condensed Chemical Dictionary, 14th Edition, Copyright 2002, Johen Wiley & Sons, Inc. one page.*

Park et al "Novel Singel-Layer Photoresist containing Cycloolefins for 193 nm", SPIE vol. 333, year 1998, pp. 454-462.*

S. Takechi, et al., Approach to High Aspect Ratio Patterning Using Cleavable Adamantyl Resist, SPIE, vol. 3049, pp. 519-525 (1997).

F.M. Houlihan, et al., Recent Advances in 193 NM Single-Layer Photoresists Based on Alternating Copolymers of Cycloolefins, SPIE, vol. 3049, pp. 84-91 (1997).

U. Okoroanyanwu, et al., New Single Layer Positive Photresists for 193 nm Photolithography, SPIE, vol. 3049, pp. 92-99 (1997).

* cited by examiner

COPOLYMER OF ALICYCLIC OLEFIN HAVING SECONDARY HYDROXYL GROUP AND ACRYL COMPOUND, AND CHEMICALLY AMPLIFIED RESIST COMPOSITION CONTAINING THE SAME

BACKGROUND OF THE INVENTION

1. The Field of the Invention

This invention relates to a novel polymer having enhanced adhesion and resolution in patterning of a resist, and a resist composition containing the same. More particularly, this invention relates to a novel polymer applicable to the fabrication of a resist composition useful for micro process using a variety of radiations, including KrF excimer laser, ArF excimer laser, $F_2$ excimer laser, X-ray, or e-beam, and a resist composition containing the polymer

2. Related Prior Art

With the progress of high-integration semiconductor devices, there has been a demand for an extra fine pattern of less than 0.10 micron in the manufacture of very LSI (Large-Scale Integration) semiconductor products. Hence, the exposure wavelength becomes much shorter than the wavelength of the conventional radiations, such as g- or i-beam, and researches on the lithography using far-ultra-violet radiation, KrF excimer laser, ArF excimer laser, $F_2$ excimer laser, X-ray, and e-beam have recently drawn considerable attention. The light sources most spotlighted in the next-generation lithography requiring a pattern of less than 0.10 micron are ArF excimer laser and $F_2$ excimer laser.

The resist composition includes a component having an acid-liable function(hereinafter, referred to as "polymer"), a component generating acids under irradiation(hereinafter, referred to as "photoacid generator"), a solvent, and in some cases, a dissolution inhibitor, or a basic additive.

The polymer used as a principal ingredient of the resist composition is supposed to contain functional groups having an adequate affinity to the developing solution, a high adhesion to the substrate, a high etch resistance, and a high resolution.

The specific examples of the functional groups may include hydroxyl groups, lactone groups, or carboxyl groups to enhance the affinity to the developing solution and the adhesion to the substrate, and norbornene derivatives or adamantane derivatives to enhance the etch resistance. However, the structure of the polymer is more important than a specific functional group in regard to enhancement of the resolution.

In an attempt to satisfy such properties, a number of copolymers have recently been developed, such as copolymers of adamantane acrylate and cyclolactone acrylate (see SPIE, Vol. 3049, pp. 519-25 (1997); or U.S. Pat. No. 6,013,416 (Nozaki, et al.)), a pure olefin copolymer (see SPIE, Vol;. 3049, pp. 92-99 (1997)), a hybrid copolymer of these monomers (see SPIE, Vol. 3049, pp. 84-91 (1997)), etc. However, these polymers are not still unsatisfactory in the aspect of the lithography performance.

SUMMARY OF THE INVENTION

It is therefore an object of the present invention to provide a polymer necessary to the preparation of a resist pattern having low dependency to the substrate, high transparency at the below radiation wavelength range, high sensitivity, high resolution, and high developability as a chemically amplified resist sensitive to KrF excimer laser, ArF excimer laser, $F_2$ excimer laser, X-ray, or e-beam.

It is another object of the present invention to provide a resist composition containing the polymer.

To achieve the objects of the present invention, there is provided a copolymer represented by the following formula 1:

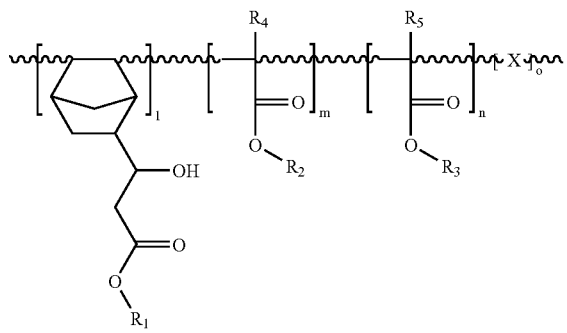

Formula 1

In the formula 1, $R_1$, $R_2$ and $R_3$ are independent to one another; $R_1$ is hydrogen, $C_1$-$C_{18}$ alkyl, $C_3$-$C_{18}$ cycloalkyl, $C_2$-$C_{18}$ alkoxyalkyl, or $C_3$-$C_{18}$ cycloalkoxyalkyl; $R_2$ and $R_3$ are hydrogen, or $C_1$-$C_{30}$ alkyl with or without an ether group, an ester group, a carbonyl group, an acetal group, an epoxy group, a nitrile group, or an aldehyde group; $R_4$ and $R_5$ are independently hydrogen or methyl; X is an olefin compound representing a norbornene derivative or a trivalent olefin derivative excepting a norbornene derivative having $R_1$ in the repeat unit l of the formula 1; and l, m, n and o are a repeat unit of the copolymer, where l+m+n+o=1, $0.1<l/(l+m+n+o)<0.8$, $0.1<m/(l+m+n+o)<0.7$, $0.1<n/(l+m+n+o)<0.7$, and $0.1<o/(l+m+n+o)<0.5$.

There is also provided a chemically amplified resist composition that includes at least one copolymer represented by the formula 1, a photoacid generator, additives, and a solvent.

Hereinafter, the present invention will be described in further detail as follows.

Polymer

The polymer represented by the formula 1 in the present invention has an acrylate derivative and an olefin derivative as a repeat unit. In some cases, the polymer can be synthesized by addition of vinyl ether, maleic anhydride, and styrene derivatives. The polymer of the present invention may be insoluble or non-soluble (or soluble in some cases) in an alkaline solution. And the polymer may have (or not in some cases) an acid-labile group in the side chain.

The solubility of the polymer to an alkaline solution depends on the type and the content of the monomers, and generally decreases with an increase in the number of hydrophobic groups included in the polymer. The resist composition using the polymer obtained by controlling the type and the content of the repeat units may be excellent in adhesion to the substrate, sensitivity and resolution without dependency to the substrate.

FIG. 1 shows an example of the compound represented by the formula 1, which is synthesized according to the Scheme 1 (Synthesis Example 1). Based on this compound, the function of the functional groups of the monomers constituting each repeat unit can be described as follows.

The norbornene group (1) of the norbornene derivative represented by the repeat unit l leads a copolymer to the copolymer having a modified helix structure and enhances the etch resistance of the polymer. In the norbornene derivative, the hydroxyl group (2) enhances adhesion but causes no crosslinking of the copolymers due to steric hindrance. The t-butyl ester group (3) affects deprotection reactions by the action of acid. This functional group is placed far from the main chain of the copolymer and liable to acids of the photoacid generator. A general acrylate copolymer is not accessible by a strong acid having a high polarity due to its helix structure. In the present invention, however, the t-butyl ester group (3) located around the main chain is very liable to a strong acid to enhance the resolution and the sensitivity of the resist composition.

Preferably, the norbornene derivative represented by the repeat unit l is included in an amount of at least 10 wt. % with respect to the total weight of monomers. If the content of the norbornene derivative of the repeat unit l is less than 10 wt. % with respect to the total weight of the monomer, then the polymer may deteriorate in resolution and adhesion with the occurrence of T-top.

The norbornene group (4) of the acrylate derivative represented by the repeat unit m is just used to enhance the etch resistance of the polymer. An excess of this monomer deteriorates the adhesion and the affinity to the developing solution. Preferably, the content of the acrylate derivate represented by the repeat unit m is in the range of 10 to 70 wt. % with respect to the total weight of monomers.

The lactone function (5) of the acryl derivative represented by the repeat unit n is used to enhance the adhesion and the affinity to the developing solution. An excess of this monomer also deteriorates the etch resistance and the pattern verticality. Preferably, the content of the acryl derivate represented by the repeat unit n is less than 70 wt. % with respect to the total weight of monomers.

If necessary, the olefin derivative represented by the repeat unit o in the formula 1 can be additionally used. The olefin derivative may be any norbornene derivative other than the "norbornene having $R_1$" as represented by the repeat unit l or trivalent olefin derivative. Preferably, the content of the olefin derivative represented by the repeat unit o is less than 50 wt. % with respect to the total weight of monomers.

This polymer represented by the formula 1 may include a block copolymer, a random copolymer or a graft copolymer.

The polymer represented by the formula 1 may be synthesized by a general polymerization method, preferably by a radical polymerization method. The initiator used for the radical polymerization reaction may be any general radical polymerization initiator and include, if not specifically limited to, azobisisobutyronitrile (AIBN), benzoyl peroxide (BPO), lauryl peroxide, azobisisocapronitrile, azobisisobaleronitrile, t-butyl hydroperoxide, etc. The polymerization reaction may be performed by bulk polymerization, solution polymerization, suspension polymerization, bulk-suspension polymerization, or emulsion polymerization. The polymerization solvent as used herein may include at leas one selected from benzene, toluene, xylene, halogenated benzene, diethylether, tetrahydrofurane (THF), esters, ethers, lactones, ketones, amides, or alcohols.

The polymerization temperature may be adequately controlled according to the type of the catalyst.

The molecular weight distribution of the polymer may also be adequately controlled by variations of the used amount of the polymerization initiator and the reaction time. After the completion of the polymerization reaction, the unreacted monomers and byproducts remaining in the reaction mixture is preferably removed by precipitation with a suitable solvent.

The polystyrene-reduced weight average molecular weight (hereinafter, referred to as "Mw") of the polymer represented by the formula 1 as measured by gel permeation chromatography (GPC) is typically in the range of 2,000 to 1,000,000, preferably 3,000 to 50,000 in consideration of sensitivity, developability, coatability and heat resistance of the polymer as a resist. The molecular weight distribution of the polymer is preferably in the range of 1.0 to 5.0, more preferably 1.0 to 3.0.

Preferably, the content of the polymer represented by the formula 1 is at least 3 wt. % in a chemically amplified resist composition.

The conventional acrylate polymers are still inapplicable to the semiconductor processing because of their shortcomings such as difficulty in the control of glass transition temperature (Tg), low solubility in a solvent, and poor etch resistance. Like the acrylate polymers, maleic anhydride-cycloolefin polymers cannot be used in the semiconductor processing due to their high absorbance that may deteriorate the pattern verticality with reduced resolution.

To overcome this problem, the present invention introduces a specific olefin functional group in the main chain of the polymer to enhance adhesion, etch resistance and resolution. The copolymer of the present invention shows excellent performances in regard to solubility in a solvent, affinity to a developing solution, adhesion, resolution, etc.

In addition, the present invention provides acid-liable groups placed far from the main chain of the copolymer so as to facilitate the reaction with a strong acid and enhance the resolution. The present invention also introduces hydroxyl groups, which generally causes a crosslinking, at a position causing no crosslinking so as to maximize adhesion and affinity to a developing solution. Although pure acrylate copolymers have a helix structure, the copolymer of the present invention having a modified helix structure is rapid in dissolution in a general solvent and very soluble in most solvents. Pure olefin copolymers are inferior in control of molecular weight, affinity to a developing solution, and resolution.

Photoacid Generator

The chemically amplified resist composition of the present invention includes a photoacid generator. The specific examples of the photoacid generator as used herein may include onium salts such as iodonium salts, sulfonium salts, phosphonium salts, diazonium salts, or pyridinium salts, and imides. Among theses salts, sulfonium salts represented by the following formula 2 or 3 are most preferred.

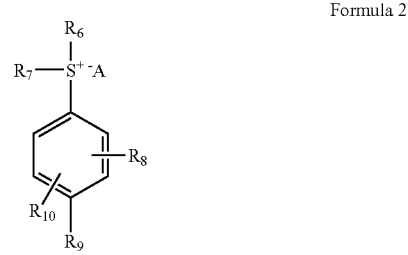

Formula 2

In the formula 2, $R_6$ and $R_7$ are independently alkyl, allyl, perfluoroalkyl, benzyl, or aryl; $R_8$, $R_9$ and $R_{10}$ are independently hydrogen, alkyl, halogen, alkoxy, aryl, thiophenoxy, thioalkoxy, or alkoxycarbonylmethoxy; and A is $OSO_2CF_3$, $OSO_2C_4F_9$, $OSO_2C_8F_{17}$, $N(C_2H_5)_2$, $N(C_4F_9)_2$, $C(CF_3)_3$, $C(C_2F_5)_3$, or $C(C_4F_9)_3$,

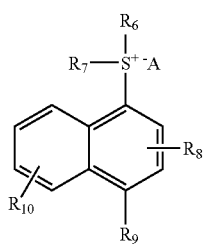

Formula 3

In the formula 3, $R_6$ to $R_{10}$ and A are as defined above.

The used amount of the photoacid generator is, based on 100 parts by weight of the solid polymer, in the range of 0.3 to 10 parts by weight, preferably 1 to 5 parts by weight. The use of an excess of the photoacid generator seriously deteriorates the pattern verticality, while the use of an excessively small amount of the photoacid generator deteriorates a flexural rigidity of the pattern. The above-mentioned photoacid generators may be used alone or in combination of at least two of them.

Additives

If necessary, the chemically amplified resist composition of the present invention may include a compound that is decomposed by an acid to accelerate dissolution to a developing solution. The specific examples of the compound decomposed by an acid to accelerate dissolution to a developing solution may include alicyclic derivatives having acid-liable groups, such as tert-butyl ester, or alkoxyalkanyl ester. The used amount of the acid-decomposable compound is, based on 100 parts by weight of the solid polymer, in the range of 2 to 60 parts by weight, preferably 5 to 20 parts by weight.

Another additives as used herein may include a surfactant, an anti-halation agent, an adhesive adjuvant, a preservative stabilizer, an antifoaming agent, etc. The resist composition of the present invention may also include a basic compound to inhibit the spread of acids generated after an exposure. The basic compound must be used in a proper amount depending on its basicity, since the sensitivity deteriorates with an increase in the used amount of the basic compound. The used amount of the basic compound is preferably, based on 100 parts by weight of the solid polymer, in the range of 0.01 to 5 parts by weight.

Solvent

To provide a uniform and even coating layer, the components of the resist composition of the present invention is dissolved in a solvent having a proper evaporation rate and a proper viscosity. The specific examples of the solvent having such properties may include ethylene glycol monomethyl ether, ethylene glycol monoethyl ether, ethylene glycol monopropyl ether, methyl celosolve acetate, ethyl celosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, γ-butyrolactone, etc. These solvents are used alone or in combination of at least two of them in some cases. The used amount of the solvent is controlled depending on the properties of the solvent, such as volatility, viscosity, or the like so as to provide a uniform coating of the resist composition on a wafer.

The resist composition of the present invention is prepared in the solution form, coated on a wafer substrate, and dried to form a resist coating layer. The method of coating the composition on the substrate includes filtering the resist solution, and coating the filtered solution on the substrate by spinning coating, flow coating, or roll coating.

The resist coating formed by the above-mentioned method is partly subjected to irradiation to form a fine pattern. The radiation as used herein is selected depending on the type of the photoacid generator and includes I-ray, KrF excimer laser, ArF excimer laser, $F_2$ excimer laser, X-ray, or charged particle beam such as e-beam.

The specific examples of the developing solution as used for development in the last step after the irradiation may include aqueous solutions containing sodium hydroxide, potassium hydroxide, sodium carbonate, sodium silicate, sodium methane silicate, ammonia, ethylamine, n-propylamine, triethylamine, tetramethylammonium hydroxide, or tetraethylammonium hydroxide. Among these developing solutions, the aqueous solution of tetramethylammonium hydroxide is most preferred. If necessary, additives such as a surfactant or an aqueous alcohol may be used.

DETAILED DESCRIPTION OF THE INVENTION

Figure 1:
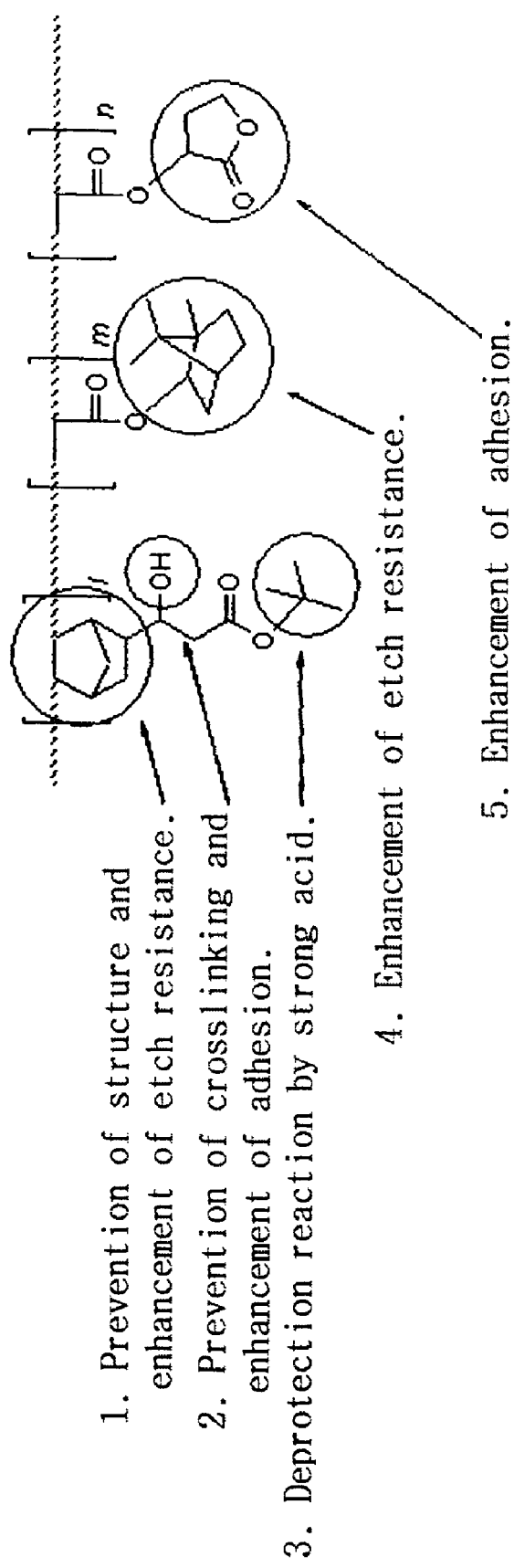
FIG. 1 shows the function of a functional group of the monomer constituting the repeat unit of the compound represented by the formula 4 obtained by the synthesis example 1 of the present invention.
Figure 2:
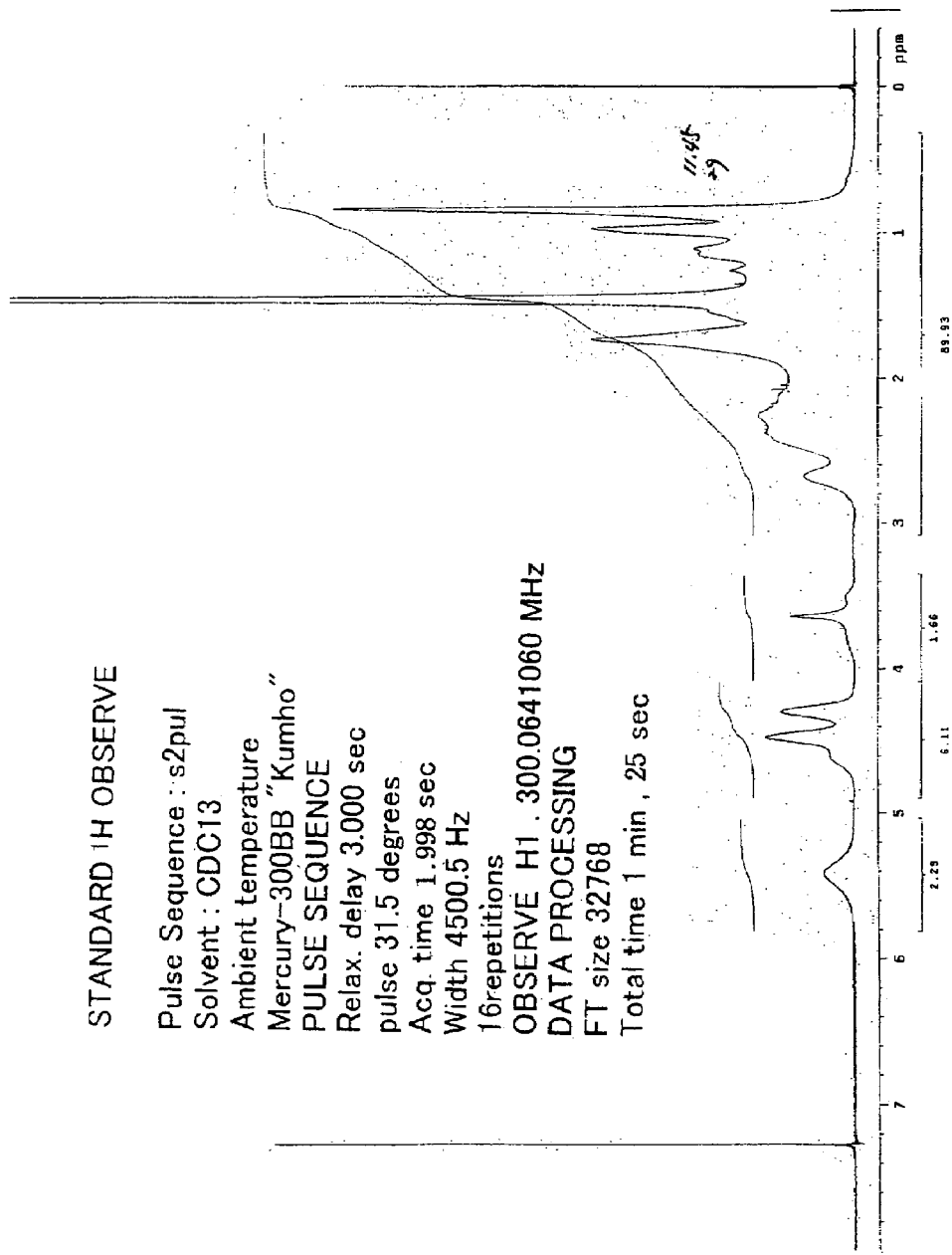
FIG. 2 is a $^1$H-NMR spectrum of the compound represented by the formula 4 as obtained by the Synthesis example 1 of the present invention.
Figure 3:
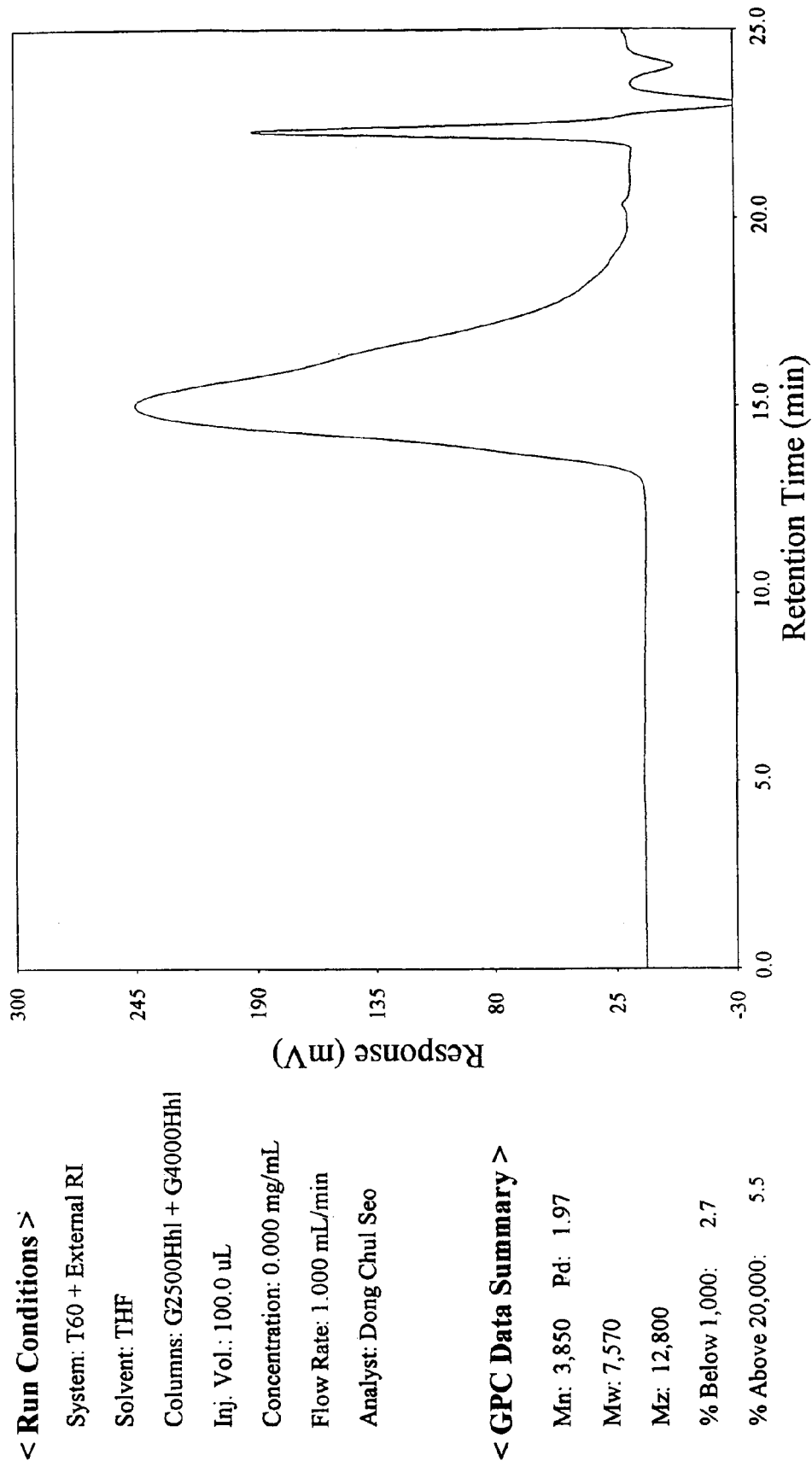
FIG. 3 is a GPC of the compound represented by the formula 4.
Figure 4:
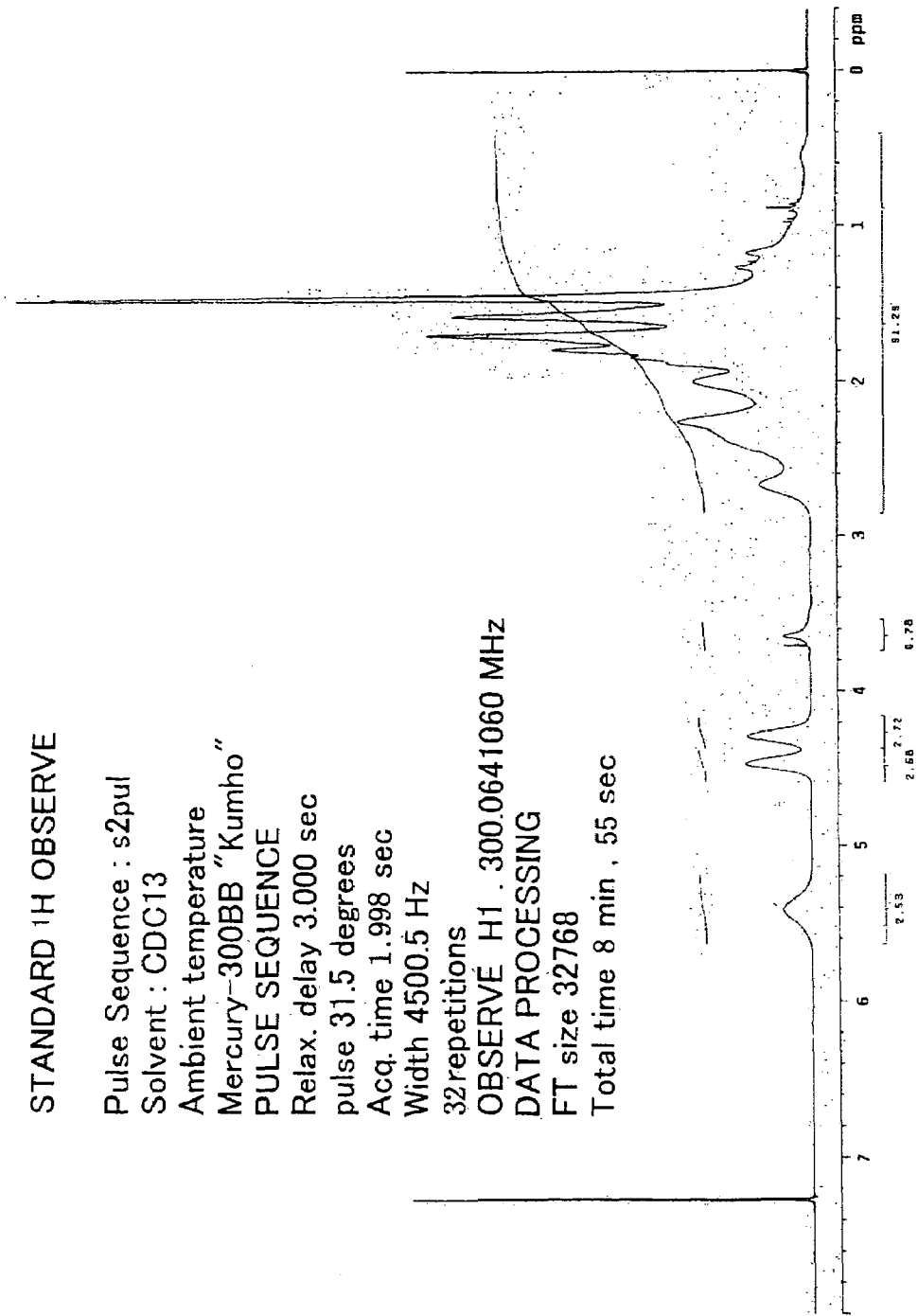
FIG. 4 is a $^1$H-NMR spectrum of the compound represented by the formula 11 as obtained by the Synthesis example 8 of the present invention.
Figure 5:
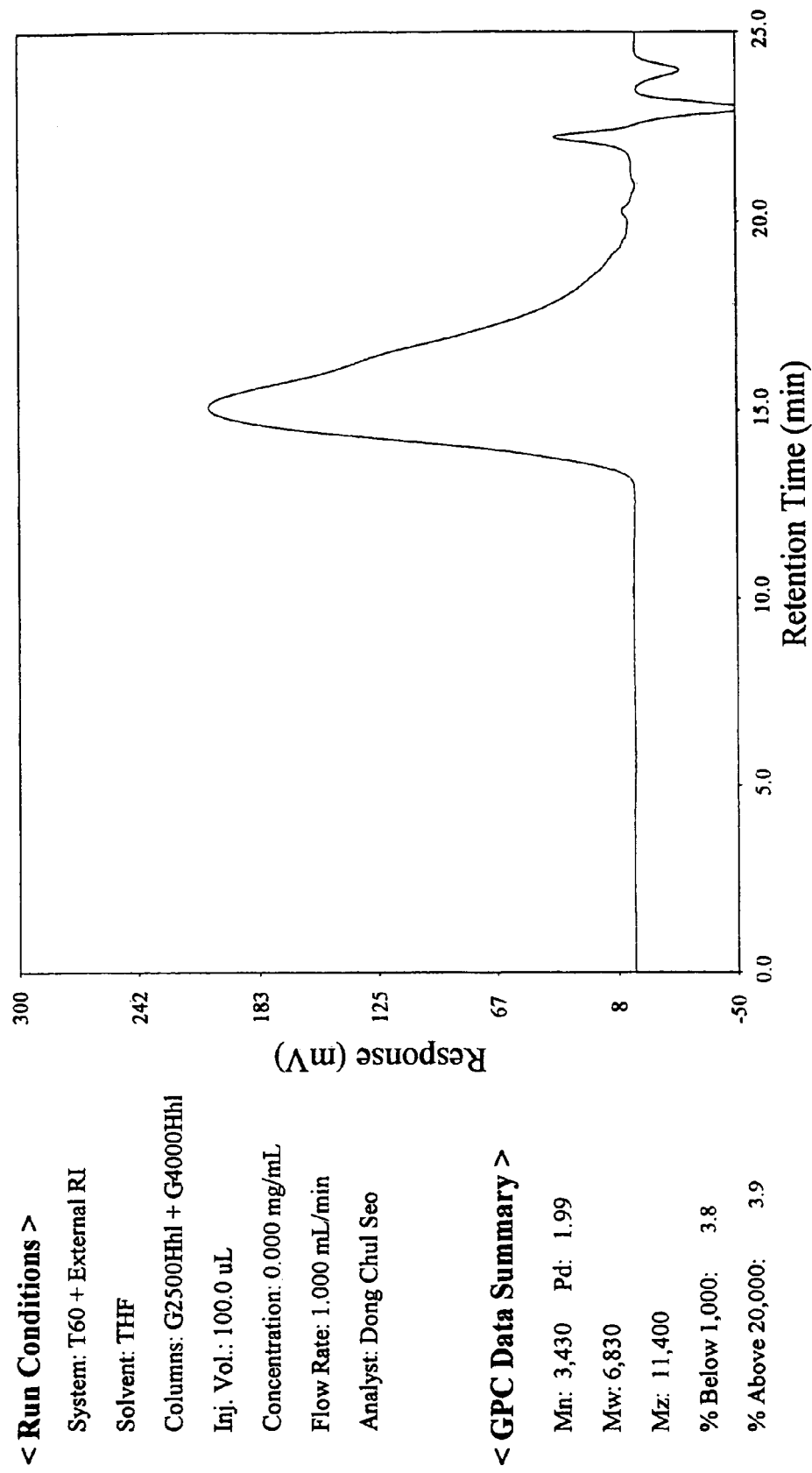
FIG. 5 is a GPC of the compound represented by the formula 11.
Figure 6:
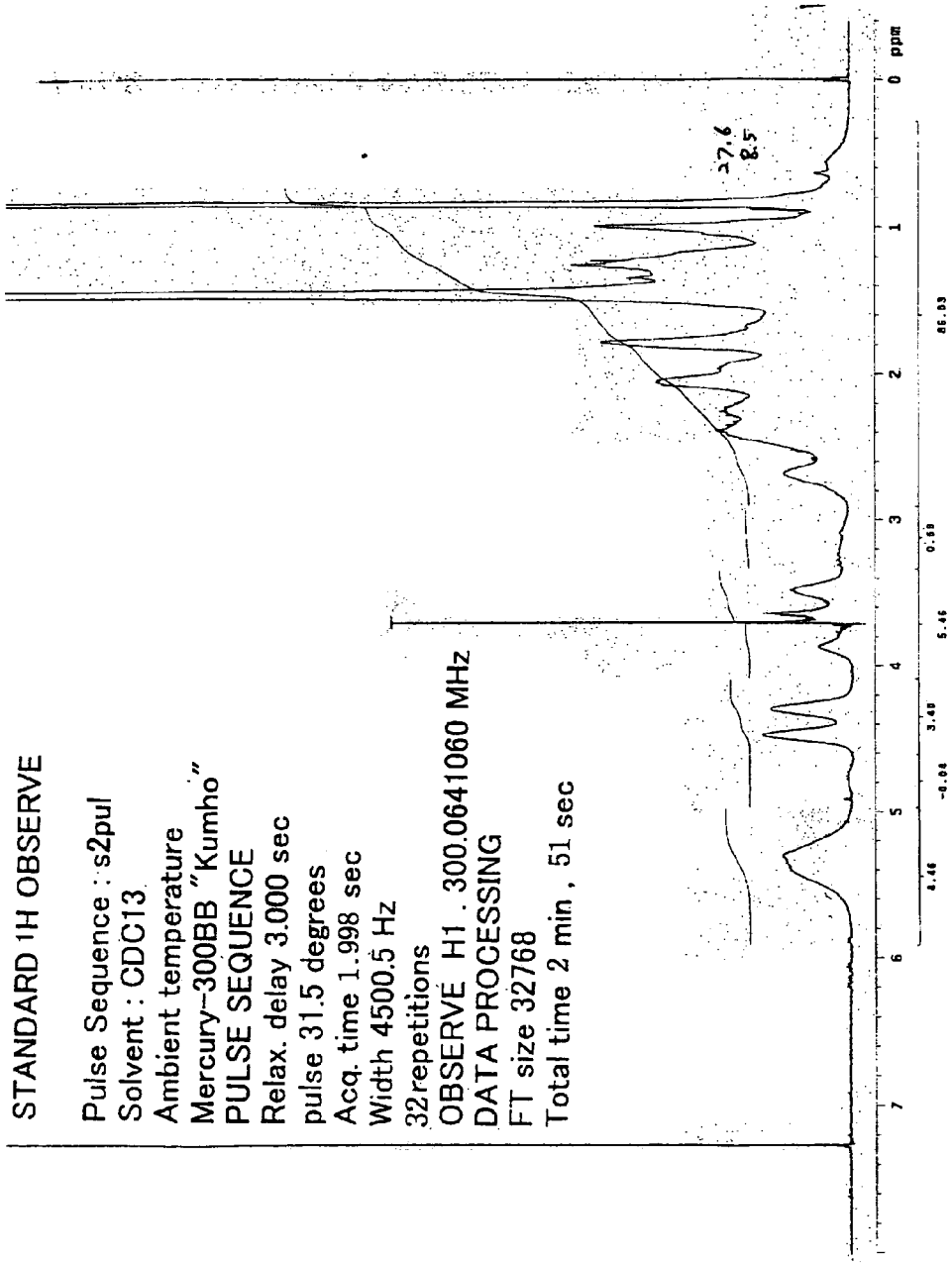
FIG. 6 is a $^1$H-NMR spectrum of the compound represented by the formula 12 as obtained by the Synthesis example 9 of the present invention.
Figure 7:
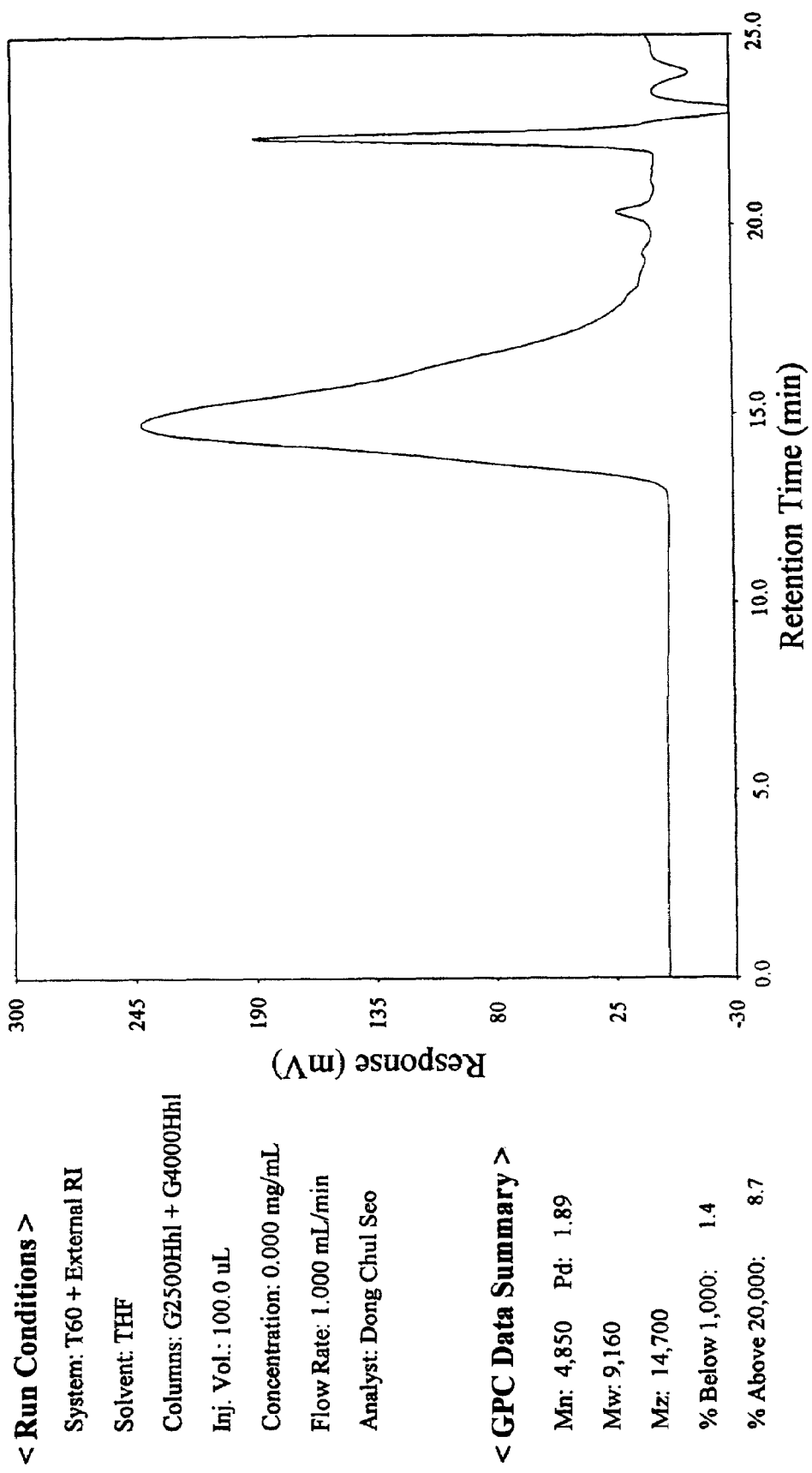
FIG. 7 is a GPC of the compound represented by the formula 12.
Figure 8:
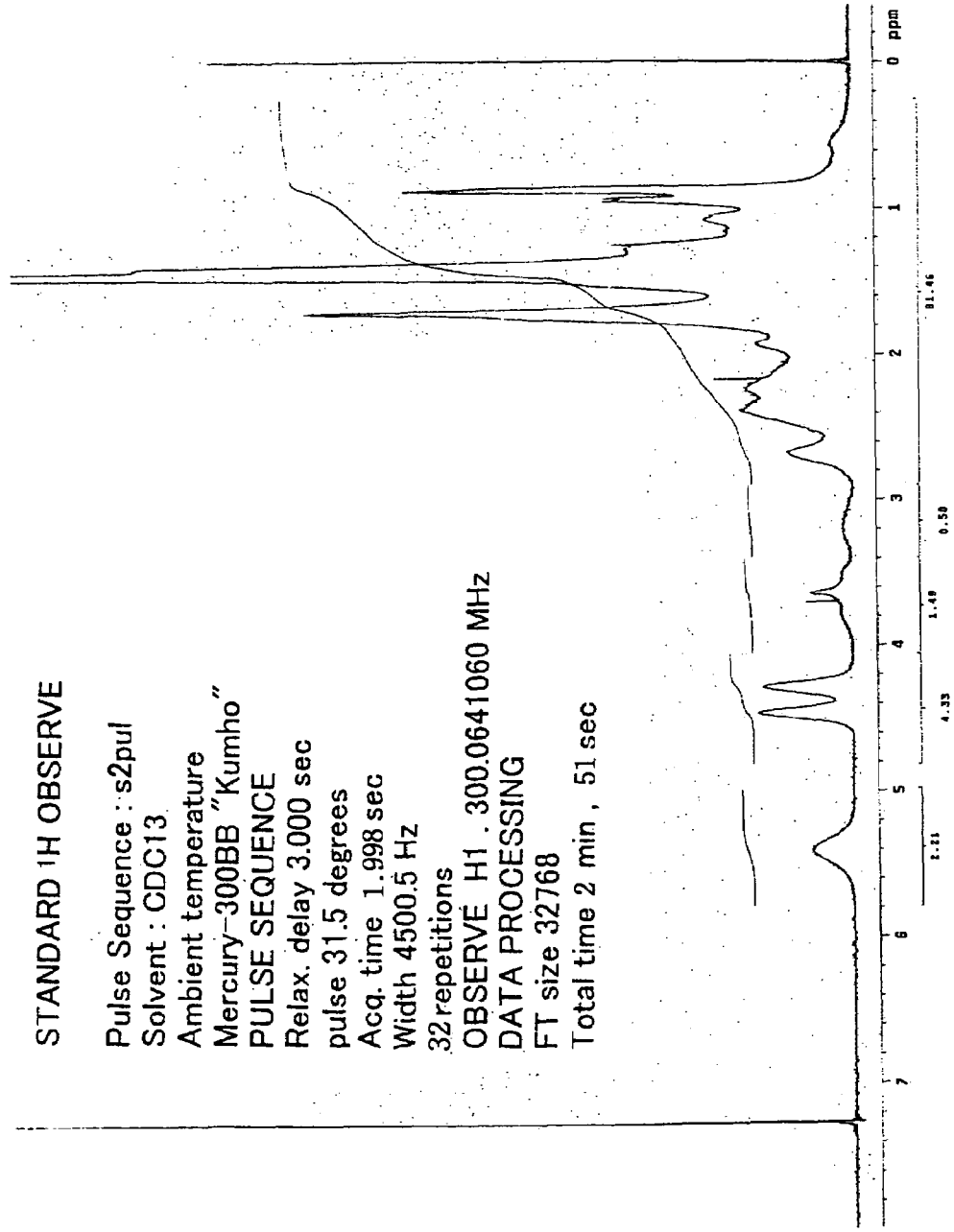
FIG. 8 is a $^1$H-NMR spectrum of the compound represented by the formula 13 as obtained by the Synthesis example 10 of the present invention.
Figure 9:
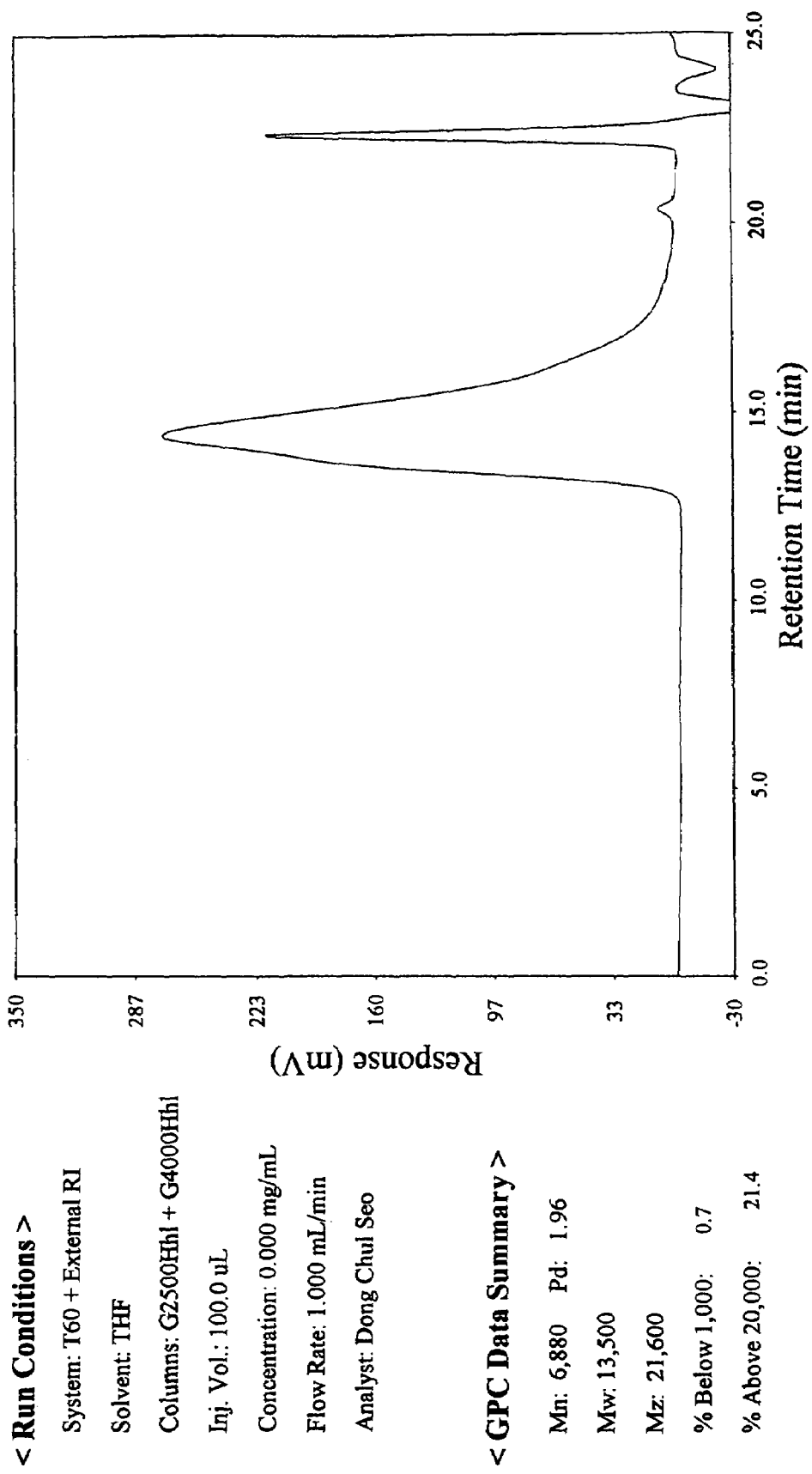
FIG. 9 is a GPC of the compound represented by the formula 13.
Figure 10:
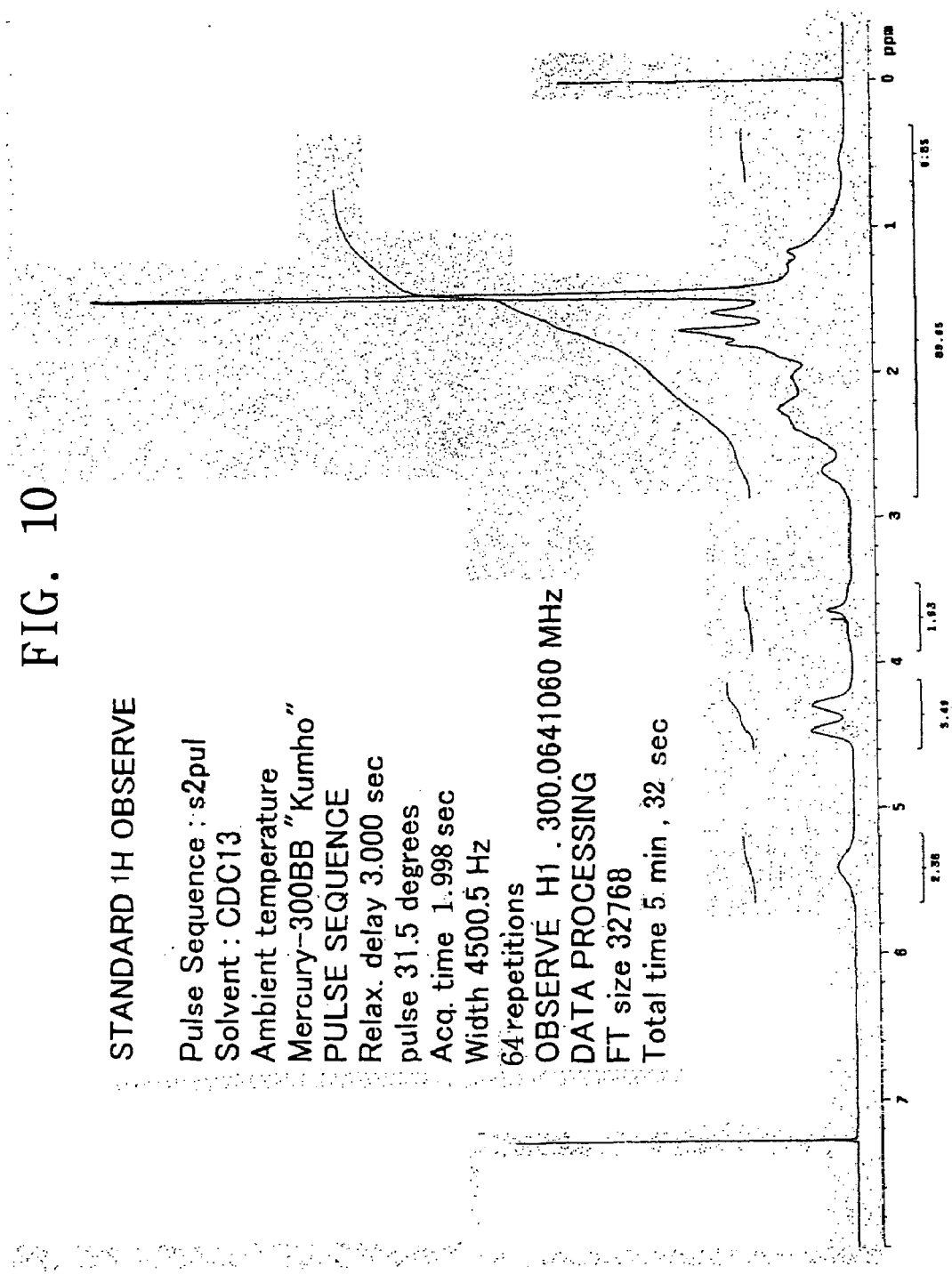
FIG. 10 is a $^1$H-NMR spectrum of the compound represented by the formula 15 as obtained by the Synthesis example 12 of the present invention.
Figure 11:
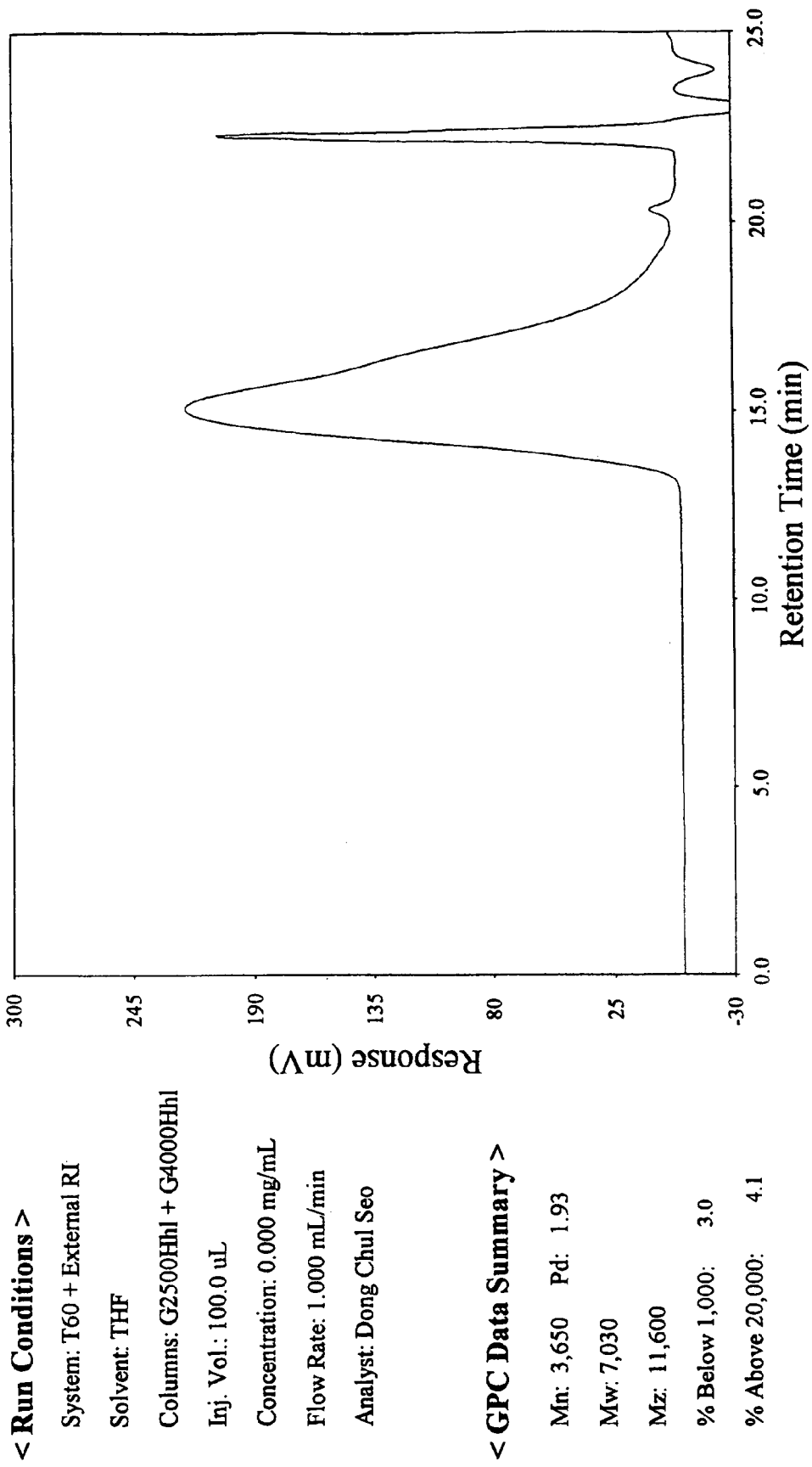
FIG. 11 is a GPC of the compound represented by the formula 15.
Figure 12:
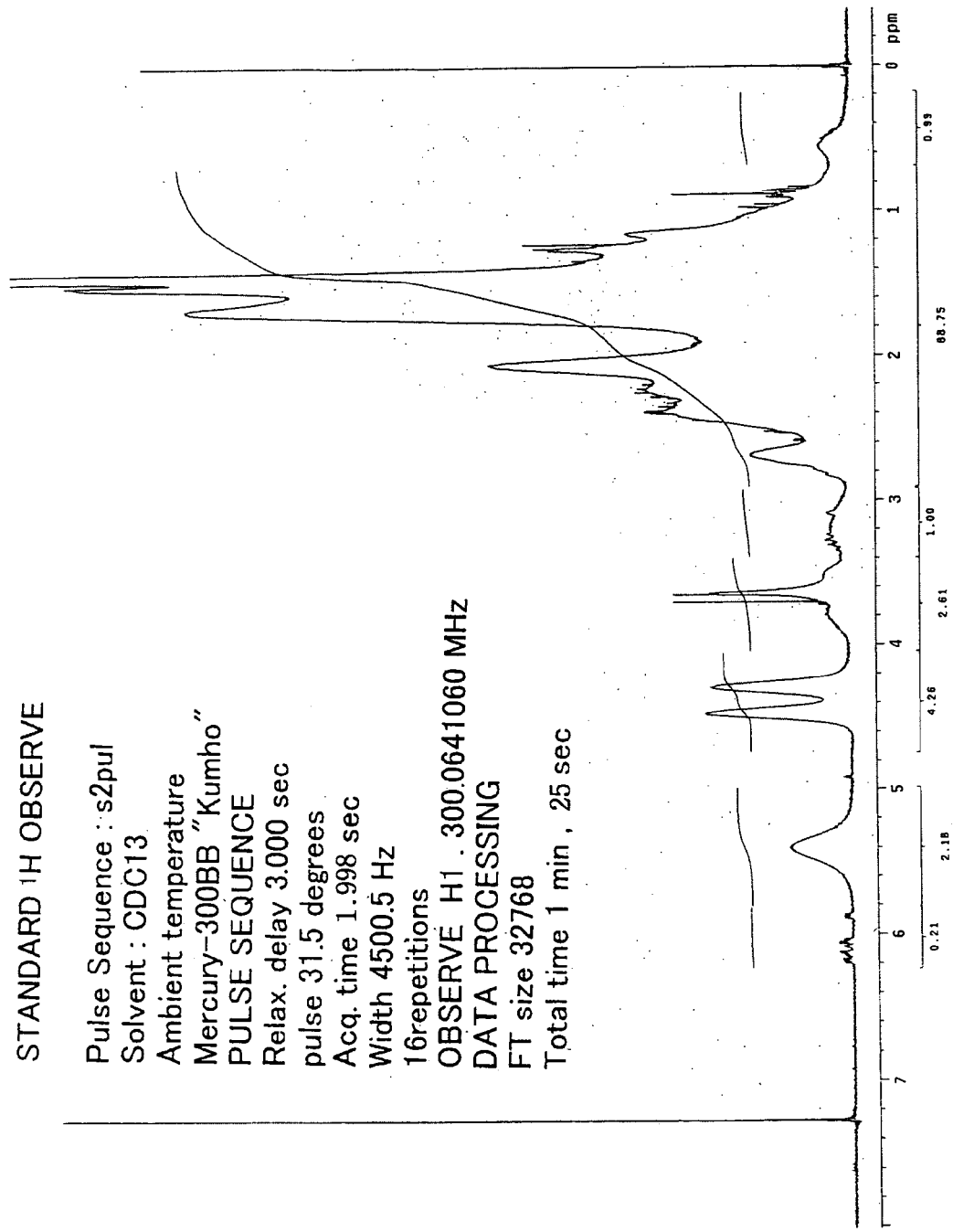
FIG. 12 is a $^1$H-NMR spectrum of the compound represented by the formula 17 as obtained by the Synthesis example 14 of the present invention.
Figure 13:
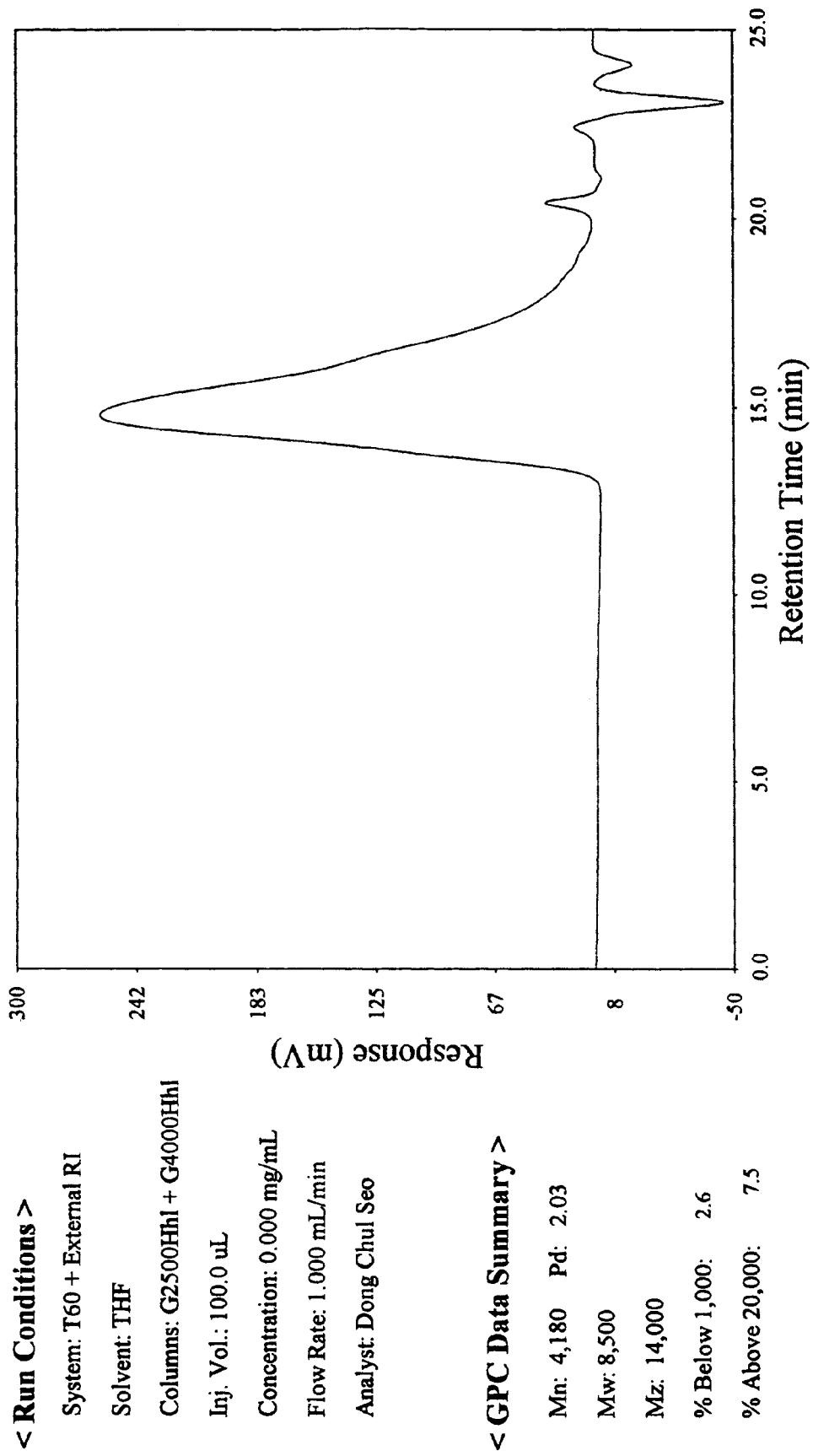
FIG. 13 is a GPC of the compound represented by the formula 17.
Figure 14:
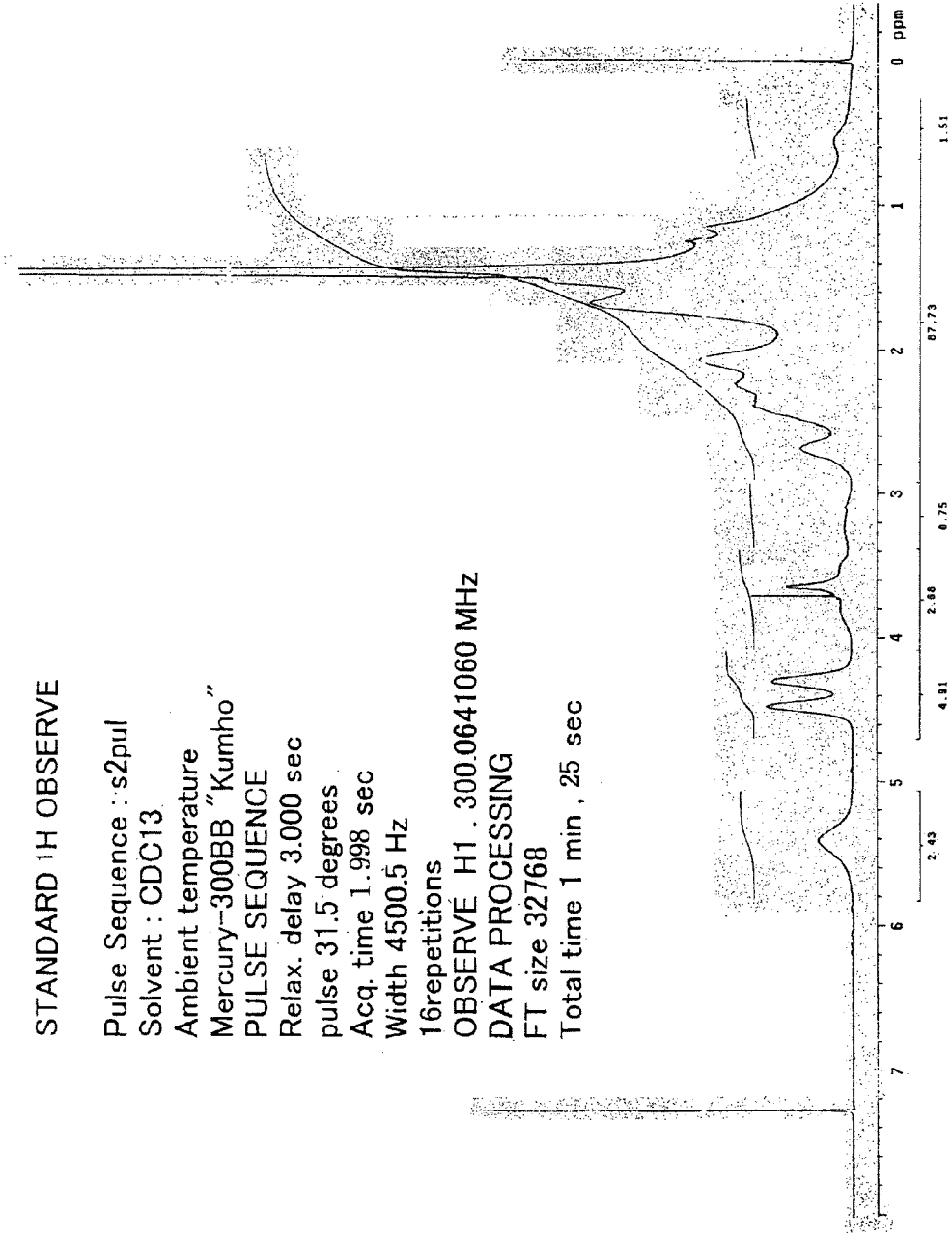
FIG. 14 is a $^1$H-NMR spectrum of the compound represented by the formula 18 as obtained by the Synthesis example 15 of the present invention.
Figure 15:
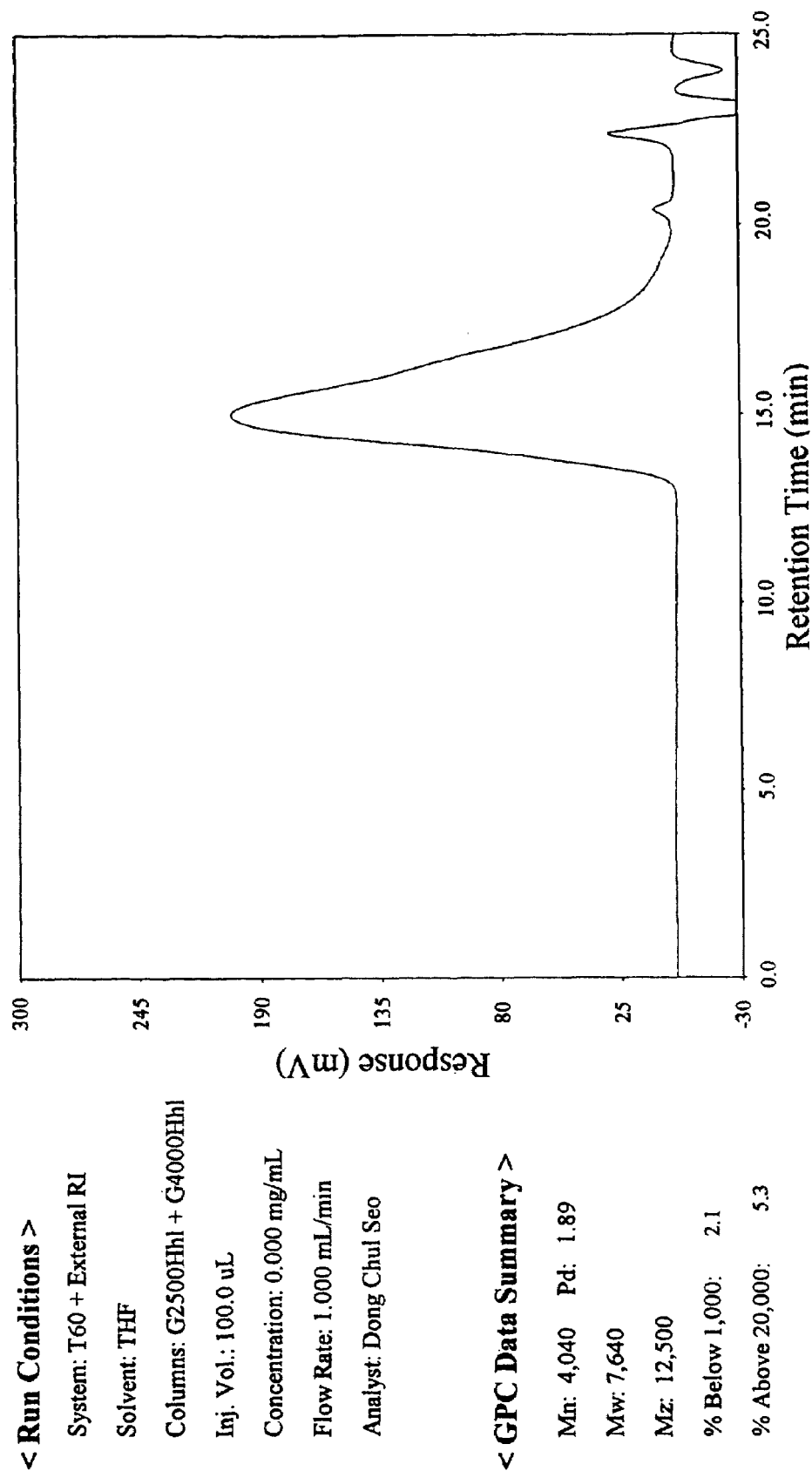
FIG. 15 is a GPC of the compound represented by the formula 18.

Now, the present invention will be described in further detail by way of the following Examples, which are not intended to limit the scope of the present invention.

SYNTHESIS EXAMPLE 1

60 g of 3-bicyclo[2,2,1]hept-2-yl-3-hydroxy-propionic acid-t-butyl ester (hereinafter, referred to as "BHP"), 26 g of isobornyl acrylate and 23 g of γ-butyrolactone acrylate were added as monomers for polymerization to a double hole type flask equipped with an agitator and a flux condenser. 3.6 g of AIBN as a polymerization initiator and 327 g of 1,4-dioxane as a polymerization solvent were added, and the reaction mixture was then stirred at the room temperature for one hour in the nitrogen atmosphere. After the completion of the polymerization reaction for 16 hours, with the reactor maintained at 65° C., the resultant solution was cooled down to the room temperature. The cooled reactant solution was precipitated with n-hexane and filtered. In filtration, the precipitate was washed with the same solvent several times and dried under vacuum to produce 73 g of the polymer of the following formula 4. The polymer thus obtained was identified in structure by $^1$H-NMR. The styrene-reduced weight average molecular weight (Mw) of the polymer was 7,570.

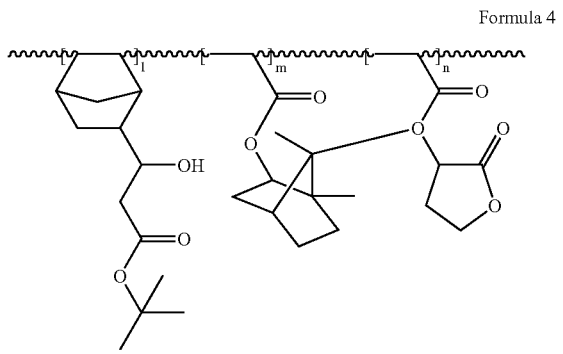

Formula 4

SYNTHESIS EXAMPLE 2

The procedures were performed in the same manner as described in the Synthesis Example 1 to obtain 47 g of the polymer represented by the following formula 5, excepting that 50 g of BHP and 23 g of 2-methyl adamantyl acrylate were added as monomers for polymerization, with 2 g of AIBN as a polymerization initiator and 220 g of 1,4-dioxane as a polymerization solvent. The polymer thus obtained was identified in structure by $^1$H-NMR. The styrene-reduced weight average molecular weight (Mw) of the polymer was 6,700.

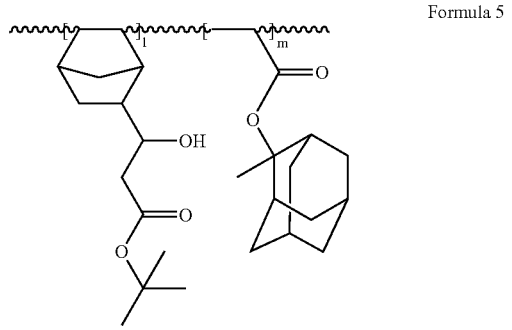

Formula 5

SYNTHESIS EXAMPLE 3

The procedures were performed in the same manner as described in the Synthesis Example 1 to obtain 32 g of the polymer represented by the following formula 6, excepting that 30 g of BHP and 23 g of γ-butyrolactone acrylate were added as monomers for polymerization, with 1.7 g of AIBN as a polymerization initiator and 160 g of 1,4-dioxane as a polymerization solvent. The polymer thus obtained was identified in structure by $^1$H-NMR. The styrene-reduced weight average molecular weight (Mw) of the polymer was 7,800.

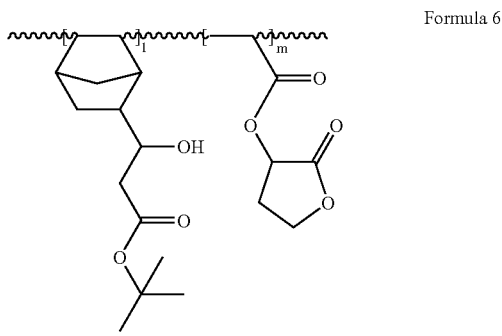

Formula 6

SYNTHESIS EXAMPLE 4

The procedures were performed in the same manner as described in the Synthesis Example 1 to obtain 32.5 g of the polymer represented by the following formula 7, excepting that 30 g of BHP and 26 g of isobornyl acrylate were added as monomers for polymerization, with 1.7 g of AIBN as a polymerization initiator and 168 g of 1,4-dioxane as a polymerization solvent. The polymer thus obtained was identified in structure by $^1$H-NMR. The styrene-reduced weight average molecular weight (Mw) of the polymer was 6,900.

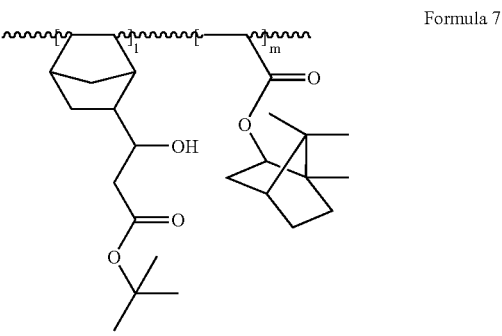

Formula 7

SYNTHESIS EXAMPLE 5

The procedures were performed in the same manner as described in the Synthesis Example 1 to obtain 54 g of the polymer represented by the following formula 8, excepting that 50 g of BHP and 51 g of 4-t-butyl-1-methoxycyclohexyl acrylate were added as monomers for polymerization, with 2.9 g of AIBN as a polymerization initiator and 100 g of 1,4-dioxane as a polymerization solvent. The polymer thus obtained was identified in structure by $^1$H-NMR. The styrene-reduced weight average molecular weight (Mw) of the polymer was 9,370.

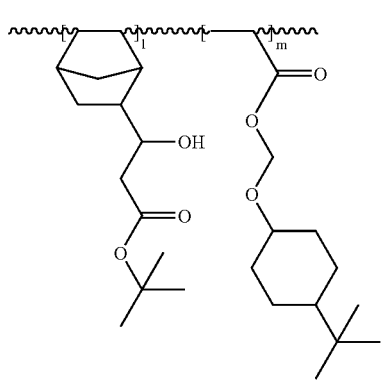

Formula 8

SYNTHESIS EXAMPLE 6

The procedures were performed in the same manner as described in the Synthesis Example 1 to obtain 38 g of the polymer represented by the following formula 9, excepting that 50 g of BHP and 22 g of 4-methyl-1-isopropylcyclohexyl acrylate were added as monomers for polymerization, with 2.2 g of AIBN as a polymerization initiator and 216 g of 1,4-dioxane as a polymerization solvent. The polymer thus obtained was identified in structure by $^1$H-NMR. The styrene-reduced weight average molecular weight (Mw) of the polymer was 9,0.

Formula 9

SYNTHESIS EXAMPLE 7

The procedures were performed in the same manner as described in the Synthesis Example 1 to obtain 24 g of the polymer represented by the following formula 10, excepting that 40 g of BHP and 9.75 g of methoxy methyl acrylate were added as monomers for polymerization, with 1.75 g of AIBN as a polymerization initiator and 150 g of 1,4-dioxane as a polymerization solvent. The polymer thus obtained was identified in structure by $^1$H-NMR. The styrene-reduced weight average molecular weight (Mw) of the polymer was 4,180.

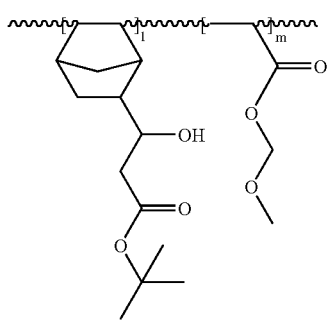

Formula 10

SYNTHESIS EXAMPLE 8

The procedures were performed in the same manner as described in the Synthesis Example 1 to obtain 63 g of the polymer represented by the following formula 11, excepting that 40 g of BHP, 37 g of 2-methyl adamantly acrylate and 29 g of γ-butyrolactone acrylate were added as monomers for polymerization, with 4 g of AIBN as a polymerization initiator and 300 g of 1,4-dioxane as a polymerization solvent. The polymer thus obtained was identified in structure by $^1$H-NMR. The styrene-reduced weight average molecular weight (Mw) of the polymer was 6,830.

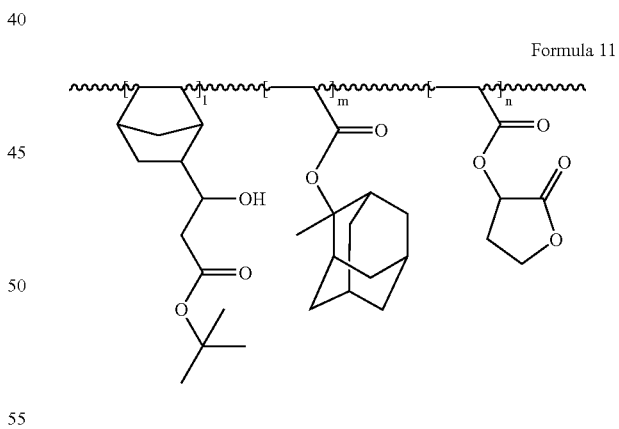

Formula 11

SYNTHESIS EXAMPLE 9

The procedures were performed in the same manner as described in the Synthesis Example 1 to obtain 55.5 g of the polymer represented by the following formula 12, excepting that 50 g of BHP, 25 g of 4-t-butyl-1-methoxycyclohexyl acrylate and 16 g of γ-butyrolactone acrylate were added as monomers for polymerization, with 2.9 g of AIBN as a polymerization initiator and 92 g of ethyl acetate as a polymerization solvent. The polymer thus obtained was identified in structure by $^1$H-NMR. The styrene-reduced weight average molecular weight (Mw) of the polymer was 9,160.

initiator and 1,4-dioxane as a polymerization solvent. The polymer thus obtained was identified in structure by $^1$H-NMR. The styrene-reduced weight average molecular weight (Mw) of the polymer was 6,700.

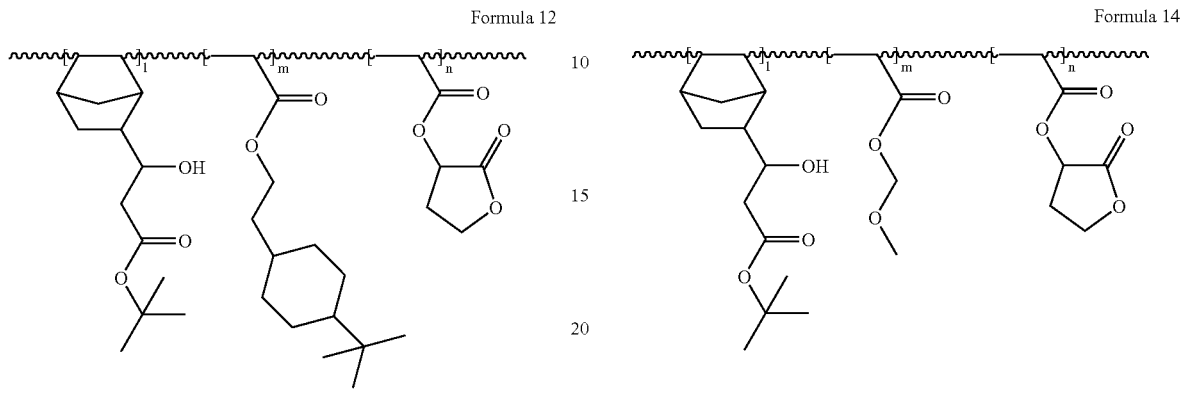

Formula 12

Formula 14

SYNTHESIS EXAMPLE 10

The procedures were performed in the same manner as described in the Synthesis Example 1 to obtain 44 g of the polymer represented by the following formula 13, excepting that 50 g of BHP, 22 g of 4-methyl-1-isopropylcyclohexyl acrylate and 16 g of γ-butyrolactone acrylate were added as monomers for polymerization, with 2.9 g of AIBN as a polymerization initiator and 88 g of ethyl acetate as a polymerization solvent. The polymer thus obtained was identified in structure by $^1$H-NMR. The styrene-reduced weight average molecular weight (Mw) of the polymer was 13,500.

SYNTHESIS EXAMPLE 12

The procedures were performed in the same manner as described in the Synthesis Example 1 to obtain 40 g of the polymer represented by the following formula 15, excepting that 50 g of BHP, 4.9 g of norbornene, 11.6 g of 2-methyl adamantly acrylate and 16.4 g of γ-butyrolactone acrylate were added as monomers for polymerization, with 2.9 g of AIBN as a polymerization initiator and 83 g of 1,4-dioxane as a polymerization solvent. The polymer thus obtained was identified in structure by $^1$H-NMR. The styrene-reduced weight average molecular weight (Mw) of the polymer was 7,030.

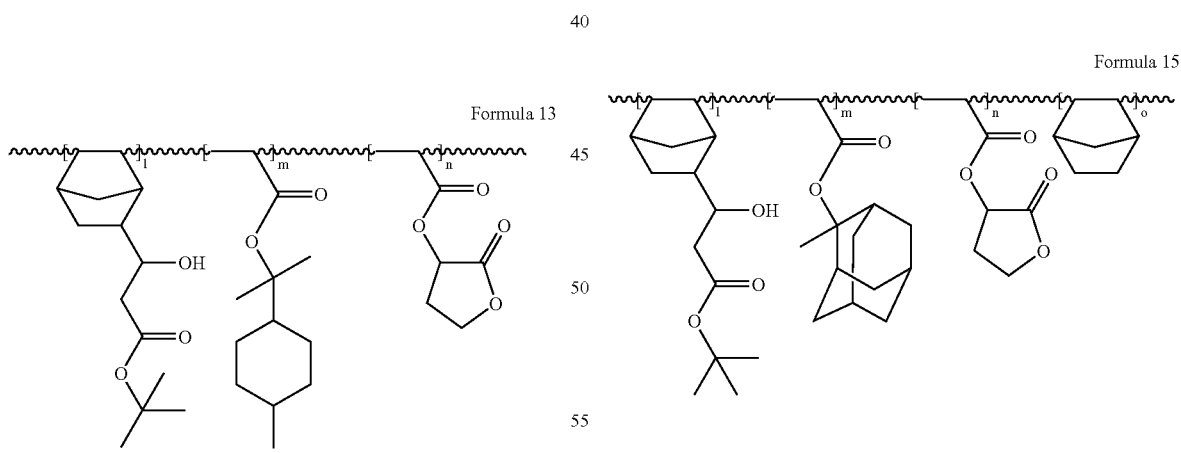

Formula 13

Formula 15

SYNTHESIS EXAMPLE 11

The procedures were performed in the same manner as described in the Synthesis Example 1 to obtain 32 g of the polymer represented by the following formula 14, excepting that 40 g of BHP, 9.8 g of methoxy methyl acrylate and 13 g of γ-butyrolactone acrylate were added as monomers for polymerization, with 1.75 g of AIBN as a polymerization

SYNTHESIS EXAMPLE 13

The procedures were performed in the same manner as described in the Synthesis Example 1 to obtain 61 g of the polymer represented by the following formula 16, excepting that 60 g of BHP, 28.2 g of 2-methyl adamantly acrylate, 21.4 g of γ-butyrolactone methacrylate and 11.8 g of nor-bornene were added as monomers for polymerization, with 4.3 g of AIBN as a polymerization initiator and 60 g of 1,4-dioxane as a polymerization solvent. The polymer thus obtained was identified in structure by $^1$H-NMR. The styrene-reduced weight average molecular weight (Mw) of the polymer was 8,090.

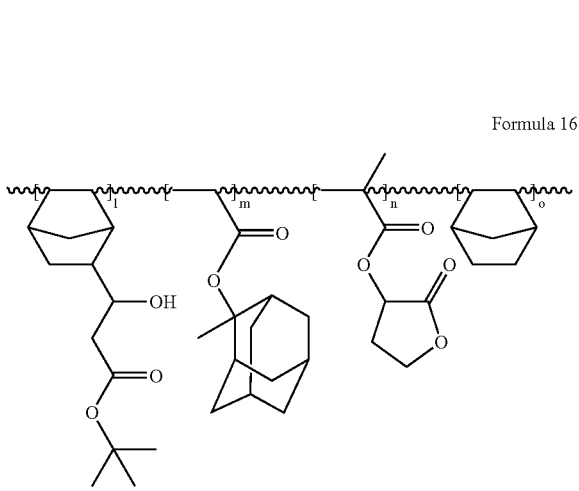

Formula 16

SYNTHESIS EXAMPLE 14

The procedures were performed in the same manner as described in the Synthesis Example 1 to obtain 62 g of the polymer represented by the following formula 17, excepting that 50.0 g of BHP, 18.5 g of 1-methyl cyclopentyl acrylate and 18.7 g of γ-butyrolactone methacrylate were added as monomers for polymerization, with 4.5 g of AIBN as a polymerization initiator and 87 g of 1,4-dioxane as a polymerization solvent. The polymer thus obtained was identified in structure by $^1$H-NMR. The styrene-reduced weight average molecular weight (Mw) of the polymer was 8,500.

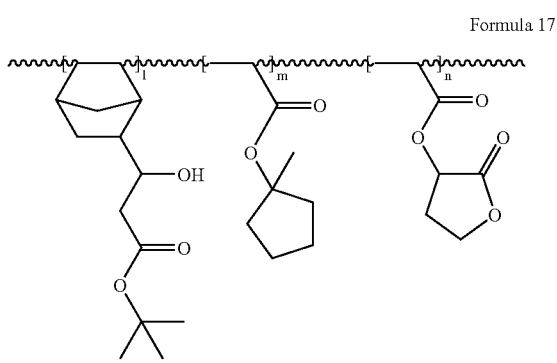

Formula 17

SYNTHESIS EXAMPLE 15

The procedures were performed in the same manner as described in the Synthesis Example 1 to obtain 44 g of the polymer represented by the following formula 18, excepting that 50.0 g of BHP, 9.7 g of 1-methyl cyclopentyl acrylate, 16.4 g of γ-butyrolactone methacrylate and 4.0 g of norbornene were added as monomers for polymerization, with 3.4 g of AIBN as a polymerization initiator and 40 g of 1,4-dioxane as a polymerization solvent. The polymer thus obtained was identified in structure by $^1$H-NMR. The styrene-reduced weight average molecular weight (Mw) of the polymer was 7,640.

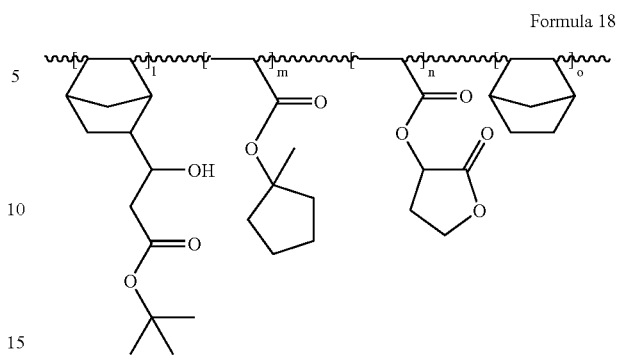

Formula 18

FABRICATION AND EVALUATION OF RESIST

EXAMPLE 1

Based on 100 parts by weight of the polymer obtained in the Synthesis Example 1, 2.0 parts by weight of triphenyl sulfonium nonaflate as a photoacid generator and 0.02 part by weight of tetramethylammonium hydroxide as a basic additive were dissolved in 550 parts by weight of propylene glycol methyl ether acetate. The mixture was then filtered through a 0.2 μm-thickness membrane filter to prepare a resist solution.

The resist solution thus obtained was coated on a substrate with a spinner and dried at 110° C. for 90 seconds to form a 0.3 μm-thickness coating film. The film thus obtained was exposed with an ArF excimer laser stepper (lens numerical aperture: 0.75) and then annealed at 130° C. for 90 seconds. Subsequently, the film was developed with an aqueous solution containing 2.38 wt. % of tetramethylammonium hydroxide for 40 seconds, washed out, and dried to form a resist pattern.

The resist pattern thus obtained was good in developability with the aqueous solution of tetramethylammonium hydroxide and adhesiveness to the substrate, with a resolution of 0.09 μm and a sensitivity of 10.5 mJ/cm$^2$.

As for adhesiveness, the adhesive condition of the 0.10 μm line end space (L/S) pattern formed after development was examined with the naked eyes and evaluated as "poor" for a bad condition such as flaking or scouring, and as "good" for no bad condition shown. In regard to sensitivity, the amount of exposure light that forms a one-to-one line width of the 0.10 μm line end space (L/S) pattern formed after development was defined as an optimal amount of exposure light. In this case, the optimal amount of exposure light was defined as the sensitivity, and the corresponding minimum pattern size after development was defined as the resolution.

EXAMPLES 2 TO 12

Each of the polymers of the Synthesis Examples 2, 8 and 12 as represented by the formulas 5, 11 and 15, a photoacid generator and a basic additive were dissolved in 550 parts by weight of propylene glycol methyl ether acetate. The resulting solution was filtered with a 0.2 μm membrane filter to prepare a resist composition represented in Table 1 (the "part" means "part by weight"). The procedures were performed to form a positive resist pattern in the same manner of the Example 1, and various tests for the resist pattern were performed. The results are presented in Table 1.

TABLE 1

| Example | Polymer (part) | *Photoacid Generator (part) | **Basic Additive (part) | Sensitivity (mJ/cm²) | Resolution (μm) | Standing wave |
|---|---|---|---|---|---|---|
| 2 | Formula 5 (100) | ª1.5 | 0.02 | 13 | 100 | Good |
| 3 | Formula 11 (100) | ª1.5 | 0.02 | 12 | 90 | Good |
| 4 | Formula 15 (100) | ª1.5 | 0.02 | 14 | 90 | Good |
| 5 | Formula 5 (100) | ª2.0 | 0.02 | 10.5 | 90 | Good |
| 6 | Formula 11 (100) | ª2.0 | 0.02 | 10 | 80 | Good |
| 7 | Formula 15 (100) | ª2.0 | 0.02 | 11 | 80 | Good |
| 8 | Formula 5 (100) | ª2.0 | 0.03 | 15 | 100 | Good |
| 9 | Formula 11 (100) | ª2.0 | 0.03 | 14 | 90 | Good |
| 10 | Formula 15 (100) | ª2.0 | 0.03 | 17 | 80 | Good |
| 11 | Formula 15 (100) | ᵇ2.0 | 0.03 | 12 | 90 | Good |
| 10 | Formula 15 (100) | ᶜ2.0 | 0.03 | 20 | 100 | Good |

*Photoacid generator a: triphenylsulfonium nonaflate, b: (4-fluorophenyl)diphenyl sulfonium nonaflate, c: dibutyl naphthyl sulfonium triflate
**Basic additive: tetramethylammonium hydroxide As shown in the above Table 1, the resist pattern obtained in each Example was good in adhesiveness and developability. The resist pattern, after being heated on a hot plate at 130° C. to observe its deformation, showed no deformation and high heat resistance.

COMPARATIVE EXAMPLES 1, 2 AND 3

A COMA resin (commercially available from Korea Kumho Petrochemical Co., Ltd.) represented by the following formula 19, a photoacid generator and a basic additive were dissolved in 550 parts by weight of propylene glycol methyl ether acetate. The resulting solution was filtered with a 0.2 μm membrane filter to prepare a resist composition represented in Table 1 (the "part" means "part by weight"). The procedures were performed to form a positive resist pattern in the same manner of the Example 1, excepting that each composition solution was exposed with an ArF excimer laser stepper (lens numerical aperture: 0.75) and that the resin used herein was represented by the formula 19. The positive resist pattern was then subjected to various tests. The results are presented in Table 2.

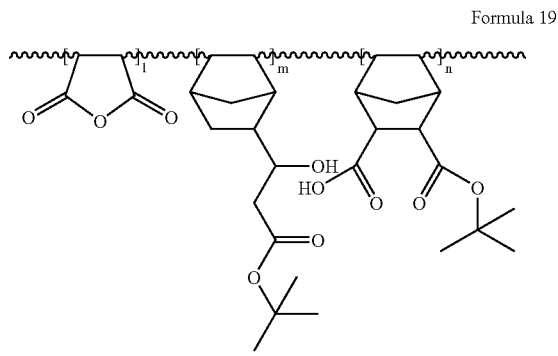

Formula 19

TABLE 2

| Comparative Example | Polymer (part) | *Photoacid Generator (part) | **Basic Additive (part) | Sensitivity (mJ/cm²) | Resolution (μm) | Standing wave |
|---|---|---|---|---|---|---|
| 1 | Formula 19 (100) | 1.5 | 0.02 | 15 | 120 | Poor |
| 2 | Formula 19 (100) | 2.0 | 0.02 | 14 | 110 | Good |
| 3 | Formula 19 (100) | 2.0 | 0.03 | 15 | 120 | Poor |

*Photoacid generator: triphenylsulfonium nonaflate,
**Basic additive: tetramethylammonium hydroxide The resin used in comparative examples 1 to 3 is a representative COMA resin. The resolution of the comparative examples 1 to 3 comes down owing to standing wave and taper situation caused by decrease in transmission of the COMA resin compared with that of used in Example resins.

As described above in detail, the present invention uses the polymer represented by the formula 1 in the fabrication of a chemically amplified resist, which polymer has acid-liable groups placed far from the main chain and hydroxyl groups introduced at a position causing no cross linking. The chemically amplified resist of the present invention is excellent in adhesion, storage stability and dry etch resistance, with good resolution in both C/H and L/S patterns, and provides a good pattern profile irrespective of the type of the substrate due to its good process window.

What is claimed is:

1. A copolymer consisting of repeating units l, m, n and o represented by the following Formula 1:

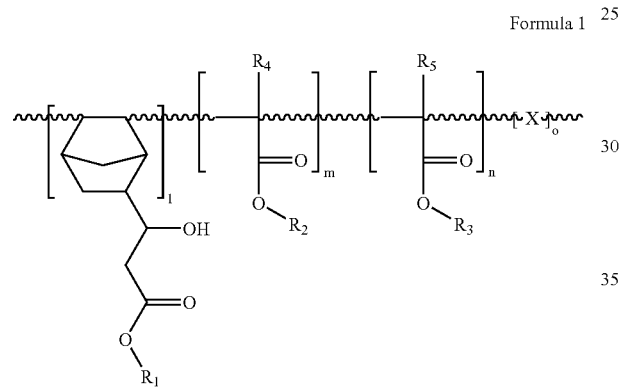

Formula 1 wherein $R_1$, $R_2$ and $R_3$ are independent to one another; $R_1$ is hydrogen, $C_1$-$C_{18}$ alkyl, $C_3$-$C_{18}$ cycloalkyl, $C_2$-$C_{18}$ alkoxyalkyl, or $C_3$-$C_{18}$ cycloalkoxyalkyl; $R_2$ and $R_3$ are hydrogen, or $C_1$-$C_{30}$ alkyl with or without an ether group, an ester group, a carbonyl group, an acetal group, an epoxy group, a nitrile group, or an aldehyde group; $R_4$ and $R_5$ are independently hydrogen or methyl; X is an olefin compound representing a norbornene derivative; and l, m, n and o are a repeat unit of the copolymer, where l+m+n+o=1, 0.1<l/(l+m+n+o)<0.8, 0.1<m/(l+m+n+o)<0.7, 0.1<n/(l+m+n+o)<0.7, and 0.1<o/(l+m+n+o)<0.5.

2. The copolymer as claimed in claim 1, wherein the repeat unit l is included in an amount of at least 10 wt. % with respect to the total weight of monomers.

3. The copolymer as claimed in claim 1, wherein the copolymer has a weight average molecular weight of 2,000 to 1,000,000.

4. A chemically amplified resist composition comprising at least one polymer selected from the copolymers consisting of repeating units l, m, n and o represented by the following Formula 1, a photoacid generator, additives, and a solvent:

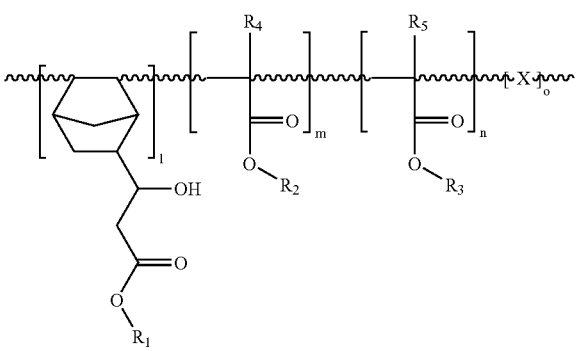

Formula 1 wherein $R_1$, $R_2$ and $R_3$ are independent to one another; $R_1$ is hydrogen, $C_1$-$C_{18}$ alkyl, $C_3$-$C_{18}$ cycloalkyl, $C_2$-$C_{18}$ alkoxyalkyl, or $C_3$-$C_{18}$ cycloalkoxyalkyl; $R_2$ and $R_3$ are hydrogen, or $C_1$-$C_{30}$ alkyl with or without an ether group, an ester group, a carbonyl group, an acetal group, an epoxy group, a nitrile group, or an aldehyde group; $R_4$ and $R_5$ are independently hydrogen or methyl; X is an olefin compound representing a norbornene derivative; and l, m, n and o are a repeat unit of the copolymer, where l+m+n+o=1, 0.1<l/(l+m+n+o)<0.8, 0.1<m/(l+m+n+o)<0.7, 0.1<n/(l+m+n+o)<0.7, and 0.1<o/(l+m+n+o)<0.5.

5. The chemically amplified resist composition as claimed in claim 4, wherein the photoacid generator includes at least one compound represented by the following formula 2 or 3:

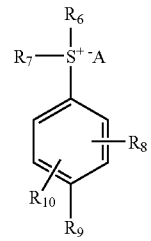

Formula 2 wherein $R_6$ and $R_7$ are independently alkyl, allyl, perfluoroalkyl, benzyl, or aryl; $R_8$, $R_9$ and $R_{10}$ are independently hydrogen, alkyl, halogen, alkoxy, aryl, thiophenoxy, thioalkoxy, or alkoxycarbonylmethoxy; and A is $OSO_2CF_3$, $OSO_2C_4F_9$, $OSO_2C_8F_{17}$, $N(C_2H_5)_2$, $N(C_4F_9)_2$, $C(CF_3)_3$, $C(C_2F_5)_3$, or $C(C_4F_9)_3$,

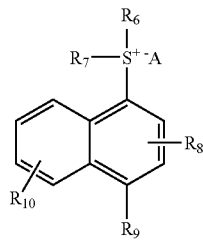

Formula 3 wherein $R_6$ to $R_{10}$, and A are the same as defined the above formula 2.

6. The chemically amplified resist composition as claimed in claim 4, wherein the photoacid generator is included in an amount of 0.3 to 10 parts by weight based on 100 parts by weight of the solid polymer.

7. The chemically amplified resist composition as claimed in claim 4, wherein the at least one polymer selected from the copolymers represented by the formula 1 is included in an amount of at least 3 wt. % with respect to the total weight of the composition.

8. The chemically amplified resist composition as claimed in claim 4, wherein the repeat unit l of the polymer represented by the formula 1 is included in an amount of at least 10 wt. % with respect to the total weight of monomers.

9. A method for forming a resist pattern comprising the steps of applying resist composition of claim 4 onto a substrate to form a coating, heat treating the coating and then exposing it to KrF, ArF, X-ray or electron beams, and developing it with a developer.

* * * * *